United States Patent
Pramanik et al.

[11] Patent Number: 5,852,497
[45] Date of Patent: Dec. 22, 1998

[54] METHOD AND APPARATUS FOR DETECTING EDGES UNDER AN OPAQUE LAYER

[75] Inventors: Dipankar Pramanik, Saratoga; Kouros Ghandehari, Fremont; Satyendra S. Sethi, Pleasanton; Daniel C. Baker, Milpitas, all of Calif.

[73] Assignee: VLSI Technology, Inc., San Jose, Calif.

[21] Appl. No.: 919,200

[22] Filed: Aug. 28, 1997

[51] Int. Cl.$^6$ .................................................. G01B 11/27
[52] U.S. Cl. ........................................... 356/401; 356/51
[58] Field of Search ..................................... 356/401, 51

[56] References Cited

U.S. PATENT DOCUMENTS

| | | | |
|---|---|---|---|
| 4,419,013 | 12/1983 | Heimer ..................................... | 356/401 |
| 4,744,666 | 5/1988 | Oshida et al. ........................... | 356/401 |
| 5,084,604 | 1/1992 | Dekker et al. ...................... | 219/121.72 |
| 5,094,539 | 3/1992 | Komoriya ................................ | 356/401 |
| 5,298,988 | 3/1994 | Everett et al. .......................... | 356/401 |

*Primary Examiner*—Richard A. Rosenberger
*Attorney, Agent, or Firm*—Burns, Doane, Swecker & Mathis LLP

[57] ABSTRACT

The present invention is directed to a method and apparatus for detecting edges through one or more opaque, planarized layers of material. Exemplary embodiments can take full advantage of decreased size geometries associated, such as 0.25 micron technologies, without suffering inaccuracies due to wafer misalignment during processing (e.g., during a photolithographic process). The invention is applicable to any process where an edge is to be detected through a planarized layer which is opaque to visible light. In an exemplary embodiment, an edge of an alignment mark can be detected using an energy source having a wavelength and angle of incidence specifically selected with respect to the optical characteristics and thickness of particular material layers being processed. According to exemplary embodiments, the wavelength of the energy source selected, such as an infrared light source, can be determined on the basis of an absorption coefficient of the planarized opaque material through which edge detection is to be performed (e.g., through a planarized polysilicon layer), and on the basis of a predetermined thickness with which the planarized polysilicon layer is formed.

11 Claims, 4 Drawing Sheets

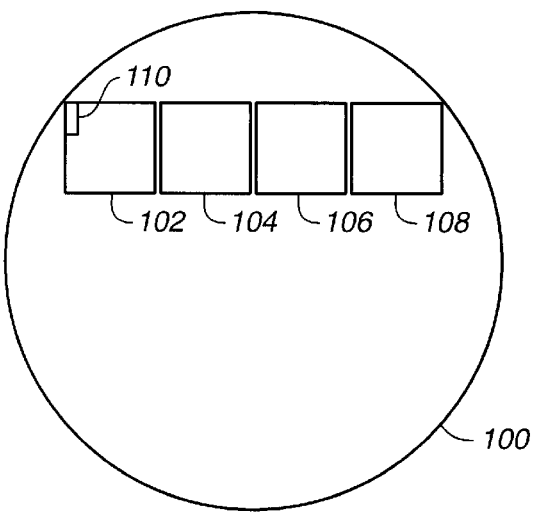
FIG._1A
(PRIOR ART)
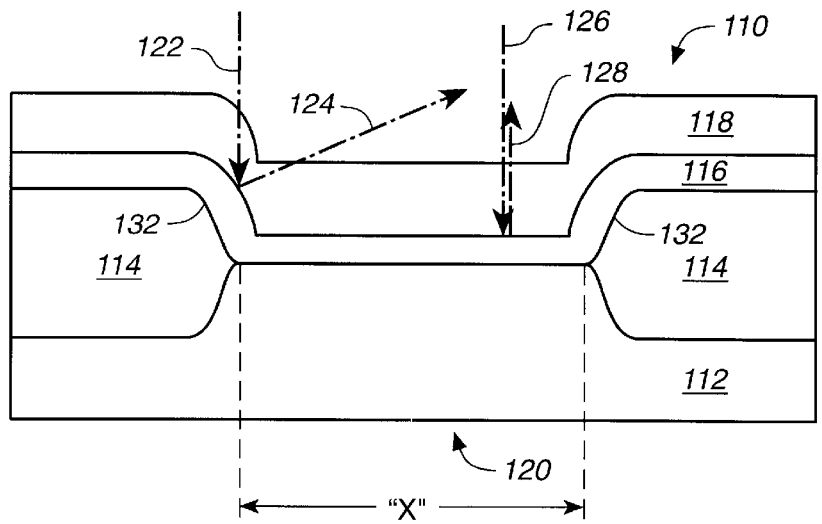
FIG._1B
(PRIOR ART)
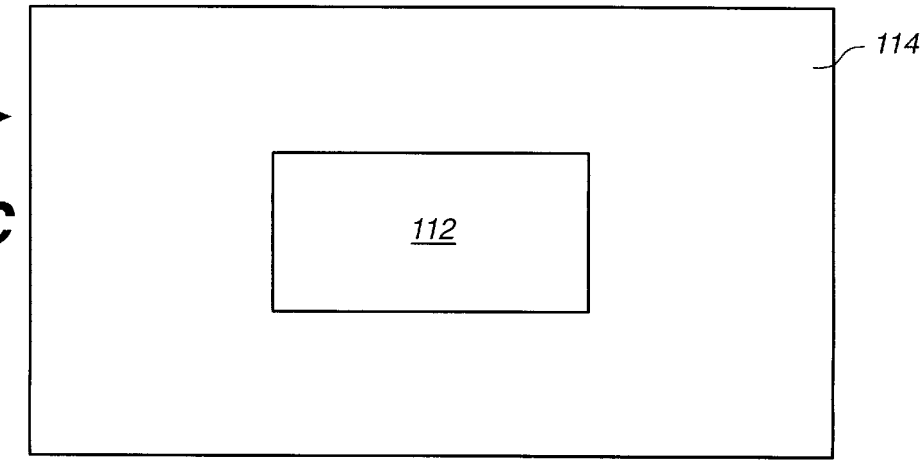
FIG._1C
(PRIOR ART)

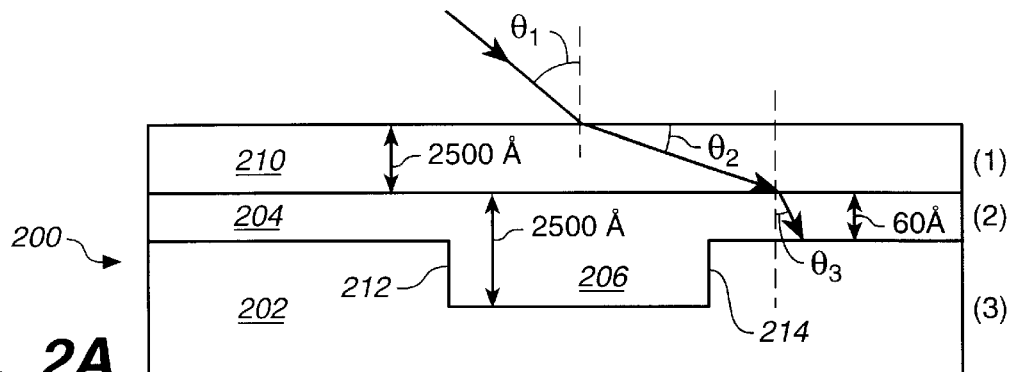
FIG._2A
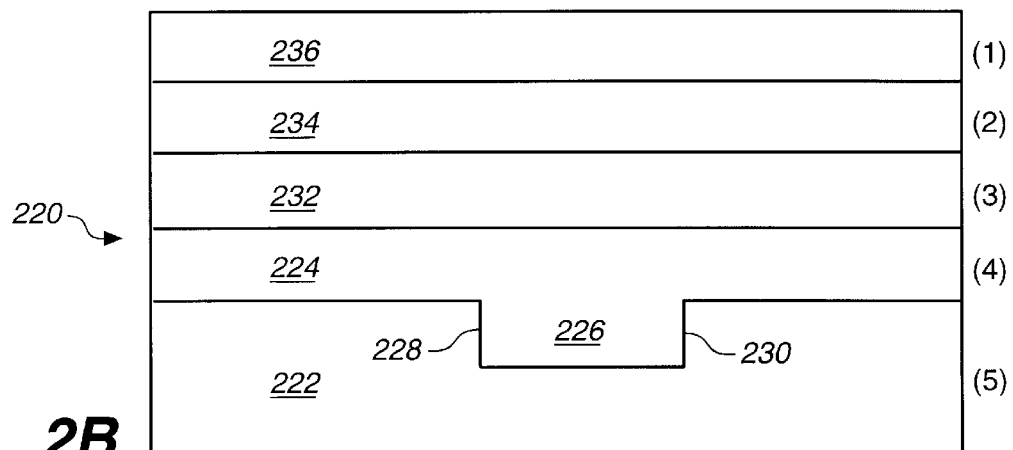
FIG._2B
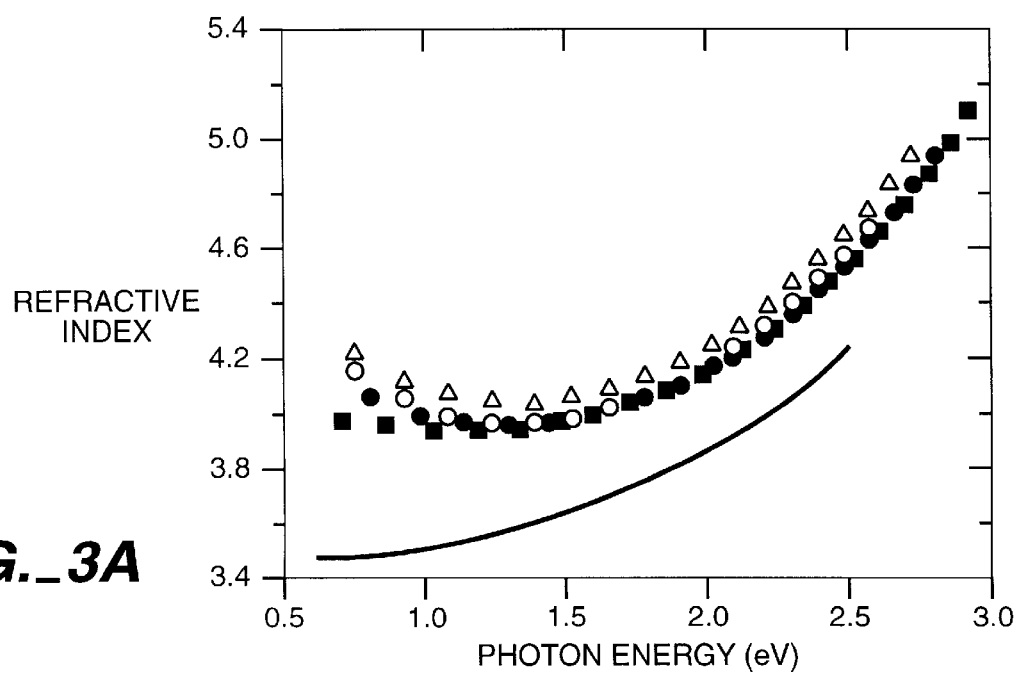
FIG._3A

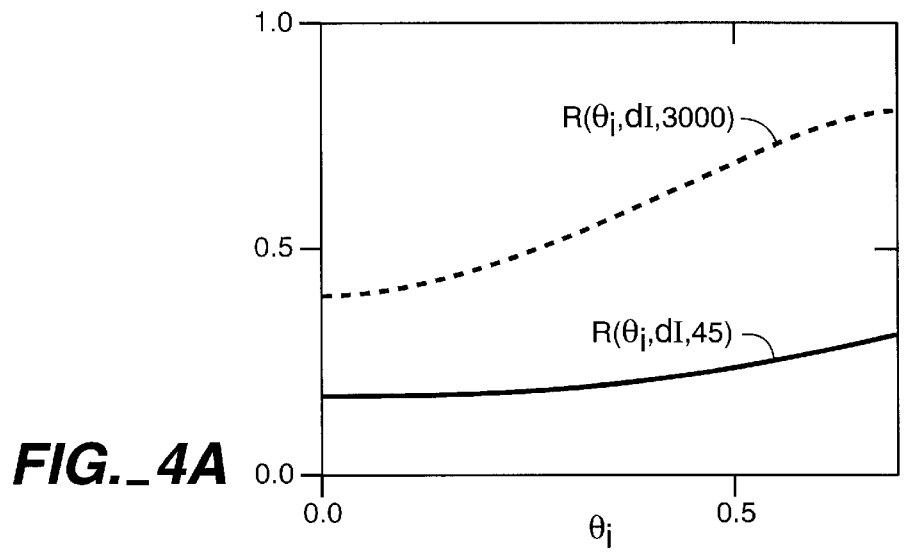
FIG._4A
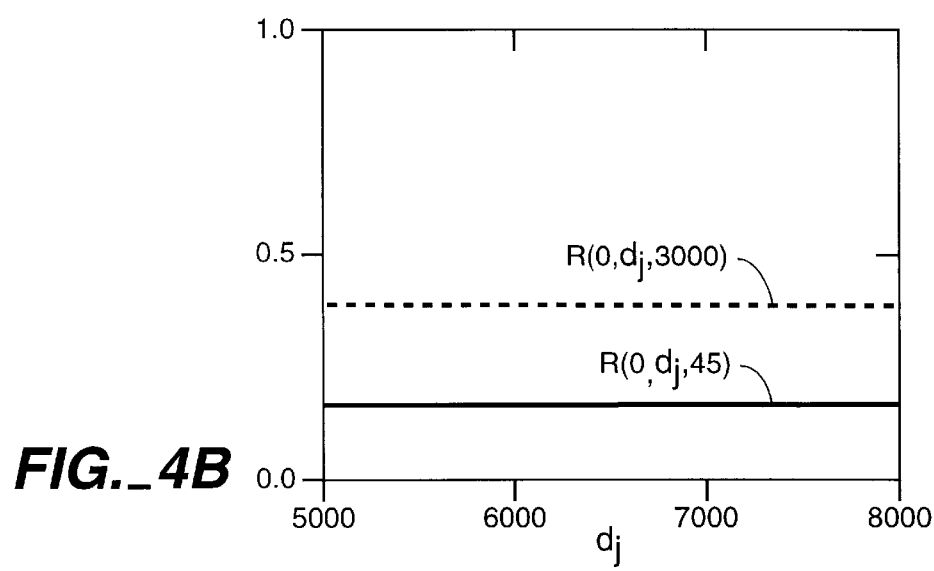
FIG._4B
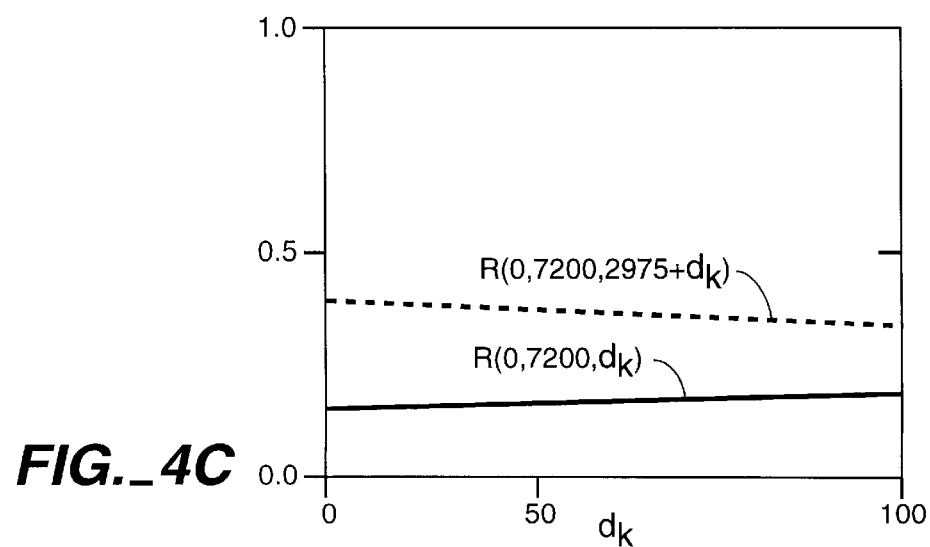
FIG._4C

METHOD AND APPARATUS FOR DETECTING EDGES UNDER AN OPAQUE LAYER

BACKGROUND OF THE INVENTION

1. Field of the Invention

The present invention relates generally to detecting boundaries or edges between different types of material which have been obstructed from view by an opaque layer, to thereby provide accuracy during such processes as semiconductor wafer alignment.

2. State of the Art

Edge detection is a well known technique used, for example, to align a layer of a component or device relative to another component or device. For example, when manufacturing semiconductor devices, a wafer upon which multiple semiconductor devices are to be formed must be aligned so that desired portions of the wafer can be subjected to photolithography and etching. Typically, a wafer, such as wafer 100 of FIG. 1A, is formed with multiple fields 102, 104, 106, 108 and so forth. For the sake of clarity, only four such fields have been shown in the FIG. 1A example, but those skilled in the art will appreciate that any number of such fields can be defined on the wafer 100. Each field typically includes an alignment mark 110, also referred to as a global alignment mark. This alignment mark is used during a photolithography process to accurately position a field with respect to a stepper that is used to expose portions of the field which are to be etched.

Referring to FIG. 1B, an alignment mark of an exemplary field 102 is illustrated in cross-section. The wafer is formed with a silicon substrate 112. At desired portions within the field 102, local oxidation silicon (i.e., LOCOS) regions, or oxide regions, 114 are formed (e.g., grown) to isolate the various devices formed in the field from one another. A polysilicon layer 116 is formed over the oxide regions and exposed portions of the silicon substrate 112. A photoresist layer 118 is then formed (e.g., coated) over the polysilicon layer 116.

When forming transistors in remaining portions of a field, the photoresist layer 118 is typically etched using a photolithography process. That is, portions of the photoresist layer 118 are masked, and unmasked portions are exposed to light (e.g., ultraviolet light). The exposed portions of the photoresist are etched using a conventional plasma etcher. Portions of the photoresist layer 118 which have been removed define a region within an exposed portion of the silicon substrate 112. For example, transistor sources and drains are established in this defined region. That is, the transistor is typically formed like the FIG 11B alignment mark, except that a region (e.g., diffusion region 120) is defined as an area where source and drain regions are to be formed.

As those skilled in the art will appreciate, efforts to more densely form electronic components on wafers, such as wafer 100, have resulted in extremely small dimensions for the various components within each field. For example, recent generations of complementary metal-oxide silicon integrated circuits (CMOS) have gate regions with dimensions on the order of 0.25 microns (micrometers). As such, increased precision is required to accurately expose and etch portions of the photoresist layer 118. The alignment marks 110 must therefore be precisely identified so that the wafer can be properly positioned for photolithography.

In the past, conventional techniques for detecting changes in material characteristics of the alignment marks were deemed adequate for accurate wafer alignment. As shown in FIG. 1B, the alignment mark 110 is typically formed as a square silicon region within a surrounding oxide region. In FIG. 1C, a top view of the FIG. 1B alignment mark 110 is illustrated prior to formation of FIG. 11B polysilicon and photoresist layers. As shown therein, an exposed portion of the substrate 112 is represented as a square within a oxide region 114. Referring to FIG. 1B, oxide regions 114 are formed with a relatively steep contour 132 so that the boundaries, or edges 132 between the oxide regions 114 and the silicon substrate 114 can be accurately detected to align the field 102 for a photolithography process. Because the polysilicon layer 116 and the photoresist layer 118 were formed over the oxide regions 114 and the silicon substrate 112, they followed the surface contour of the wafer topography in existence prior to formation of the polysilicon layer 116.

To identify edges 132 of the substrate region which is labeled "x" in FIG. 1B, either dark field or bright field projection has typically been used, with a light source that will be reflected by the polysilicon layer. That is, an incident light beam 122 in the visible spectrum is directed perpendicular to the photoresist layer 118, so as to be transmitted through the photoresist for reflection by the polysilicon, the polysilicon being opaque with respect to the light source selected. Edges of the substrate region "x" are often detected using, for example, broad band or white light illumination (such as tungsten halogen sources), or monochromatic light using helium-neon (He-Ne) laser sources. The light sources are typically mounted internally to a stepper device used to perform the photolithography, and the alignment marks are detected using charge coupled device (CCD) cameras.

The visible light beam is selected for transmission through the photoresist layer 118 and for reflection as a reflected light beam 124 from the polysilicon layer 116. Because the surface contour of the polysilicon layer 116 is displaced in a downwards direction at boundaries between oxide region 114 and the silicon substrate 112, different angles of the reflected light beam 124 can be used to identify these boundaries.

For example, the visible light beam 122 would be reflected at an angle of $\sigma_1$ at the boundary between the oxide region 114 shown to the left hand side of FIG. 1B and the silicon substrate 112. In contrast, a visible light beam 126 which is directed perpendicular to the photoresist layer 118 would be reflected along the path of the incident light; that is, the angle of a reflected light beam 128 with respect to the incident light beam 126 would be zero.

Although the foregoing process has been deemed satisfactory for detecting edges of an alignment mark 110 to position a wafer 100 for subsequent processing, recent developments in semiconductor processing have rendered this technique inadequate. The conventional detection of alignment marks 110 relies on the surface topography (such as the exposed upper surface of polysilicon layer 116) to vary in the vertical plane of FIG. 1B. However, problems exist when using this process with more recent integrated circuit fabrication technologies, such as 0.25 micron technology. With this more recently developed technology, local oxidation silicon isolation is often no longer used. Rather, shallow trench isolation (STI) is used, wherein chemical mechanical polishing (CMP) planarizes the topography of the alignment marks 110. Because the polysilicon layer is opaque to the conventional white light source and the HeNe source, and because the alignment marks have been planarized, boundaries between different materials used to form the alignment marks become undetectable with conventional edge detection processes. As such, the wafer 100 can no longer be aligned within the stepper.

Accordingly, it would be desirable to develop a process which does not rely on topographical surface variations to detect edges, and which is capable of detecting edges through one or more layers of material.

SUMMARY OF THE INVENTION

The present invention is directed to a method and apparatus for detecting edges through one or more opaque, planarized layers of material. Exemplary embodiments can take full advantage of decreased size geometries associated, such as 0.25 micron technologies, without suffering inaccuracies due to wafer misalignment during processing (e.g., during a photolithographic process). The invention is applicable to any process where an edge is to be detected through a planarized layer which is opaque to visible light. In an exemplary embodiment, an edge of an alignment mark can be detected using an energy source having a wavelength and angle of incidence specifically selected with respect to the optical characteristics and thicknesses of particular material layers being processed. According to exemplary embodiments, the wavelength of the energy source selected, such as an infrared light source, can be determined on the basis of an absorption coefficient of the planarized opaque material through which edge detection is to be performed (e.g., through a planarized polysilicon layer), and on the basis of a predetermined thickness with which the planarized polysilicon layer is formed.

Generally speaking, exemplary embodiments relate to a process for detecting edges through a planarized layer which is opaque to visible light by: selecting a thickness of the opaque layer which is, for example, governed by the properties of the device being constructed; determining a wavelength of a predetermined energy source (such as a predetermined light source) to be used for the edge detection based on an absorption coefficient of the opaque layer; determining an angle of incidence with which the energy source enters the opaque layer, and detecting the intensity of the energy source which is reflected by material which has been obscured from a view of the energy source by the opaque layer.

Further, exemplary embodiments relate to an alignment mark formed within a device, for indexing said device, said alignment mark comprising: a substrate; at least one isolation trench oxide formed upon said substrate; a planarized opaque layer formed upon said isolation trench oxide, said planarized, opaque layer having a thickness and an absorption coefficient selected in accordance with a wavelength of an energy source used to detect a boundary between said substrate and said isolation trench oxide.

BRIEF DESCRIPTION OF THE DRAWINGS

The present invention can be further understood with reference to the following description and the appended drawings, wherein like elements are provided with the same reference numerals. In the drawings:

FIGS. 1A–1C illustrate a conventional alignment mark for use in aligning the fields of a wafer;

FIG. 2A illustrates an alignment mark formed with a planarized layer, having characteristics selected in accordance with an exemplary embodiment of the present invention;

FIG. 2B illustrates an exemplary alignment mark which includes multiple layers of materials having different refractive indices;

FIGS. 3A and 3B illustrate graphical plots of photon energy with refractive indices and absorption coefficients;

FIGS. 4A to 4C illustrate graphs of substrate reflectivity for various conditions.

DETAILED DESCRIPTION OF THE PREFERRED EMBODIMENTS

Figure 3B:
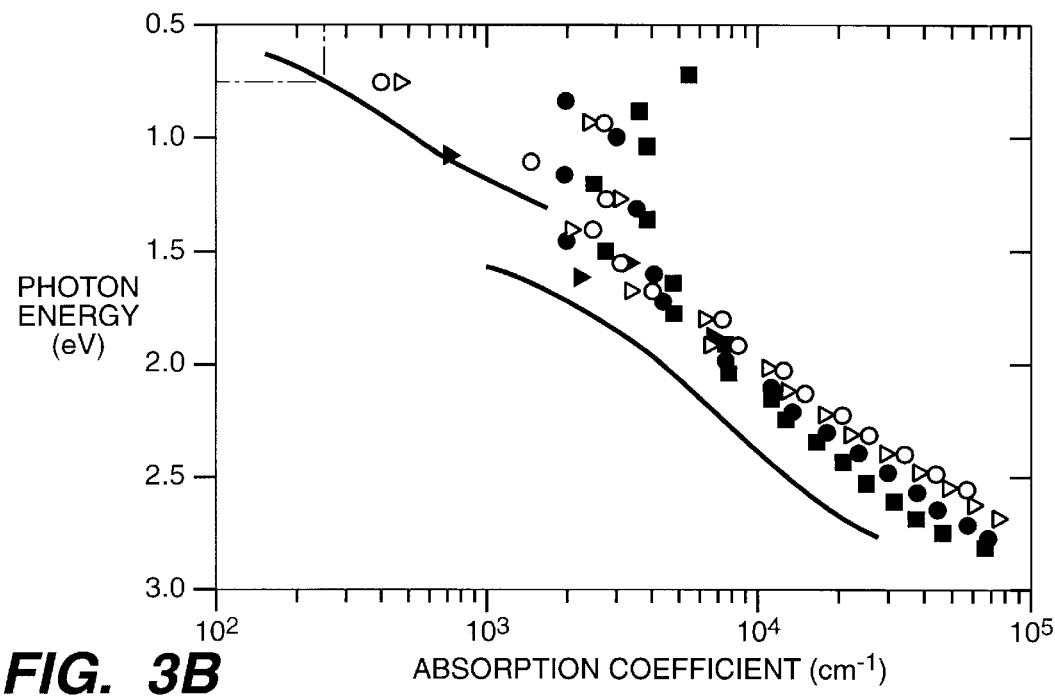

FIG. 2 illustrates a global alignment mark 200 having a planarized topography. The alignment mark 200 serves as an alignment mark of, for example, the fields illustrated in the FIG. 1A wafer 100. As such, the alignment mark 200 can be used by any conventional semiconductor wafer processing device, such as a stepper or scanner, to align a field. Typical stepper devices which can make use of exemplary embodiments of the present invention include those readily available, including steppers such as the Canon 14. However, those skilled in the art will appreciate that the edge detection can be used for any desired process where accurate alignment is required including, but not limited to, aligning a wafer for subsequent processing (e.g., subsequent photolithographic exposure and etching), aligning and/or measuring specific points on a die, and micromachining a component to precisely form via holes at specific locations of the component.

The exemplary FIG. 2 alignment mark, includes a silicon substrate 202 covered by a silicon dioxide layer 204. The global alignment mark 200 is formed with a shallow trench isolation region 206 that is adjacent the thicker silicon dioxide layer 204. At least a portion of the additional silicon dioxide layer 204 can, for example, be considered, a gate oxide region of a transistor, the layer 204 having a thickness which is thinner than that of the silicon dioxide layer 204. Using any available planarization process, such as chemical mechanical polishing, a surface topography of the alignment mark is established as a planar surface 208. A planarized polysilicon layer 210 is formed over the planared surface 208.

The silicon substrate 202 can be covered by approximately 60 angstroms of silicon dioxide, with shallow trench isolation region 206 being located at the global alignment mark. In the trench regions, the thickness of the silicon dioxide can, for example, be on the order of 2500 angstroms. An area covering both the mark and its surroundings is planarized using the aforementioned chemical mechanical polishing processing, and then covered with 2500 angstroms of polysilicon.

Exemplary embodiments of the present invention are directed to a process for modifying formation of the alignment mark 200 and/or modifying a process for detecting edges 212 and 214 through the polysilicon layer 210. In accordance with exemplary embodiments, the polysilicon layer 210 is formed as an opaque layer (that is, opaque to visible light), having a predetermined thickness selected in advance. Alternately, the planarized polysilicon layer can be formed with a random thickness, which is then measured so that a predetermined thickness of the polysilicon layer can be established. The thickness of the opaque layer (in this case, the polysilicon layer 210) can be selected by taking into account the material characteristics of the layer, such as the absorption coefficient, and the energy source which will be used to provide detection of the edges 212 and 214.

For example, according to exemplary embodiments, a relatively long wavelength source (that is, relative to energy sources typically used for edge detection of global alignment marks), can be used, the wavelength being selected to fall below the band gap of silicon. Assuming the band gap of the silicon to have a photon energy of 1.1 leV, corresponding to a wavelength λ of 1.1 microns, the source can be a laser having a wavelength selected to be, for example, 1.1 microns.

By first selecting an approximated expected energy source having a given wavelength, and then selecting a predetermined thickness of the polysilicon layer in accordance with the approximated energy source, the trial and error procedure required to select a combination of layer thickness and energy source wavelength which will provide accurate edge detection can be reduced considerably. Regarding the selection of an appropriate, approximated energy source wavelength, reference is made to a book entitled "A User's Guide To Ellipsometry", by Harland G. Tompkins, the contents of which are hereby incorporated by reference in their entirety, wherein an absorption coefficient α is provided for different forms of silicon. A polysilicon layer is indicated in the Tompkins book to have an absorption coefficient α of approximately $2 \times 10^3$ centimeters $^{-1}$, where photon energy of the polysilicon is below 1.2 eV. When the photon energy is 2.0 eV, the absorption coefficient of polysilicon is four times greater (i.e., $8 \times 10^3 cm^{-1}$).

Having selected a predetermined thickness of the opaque layer relative to an approximate wavelength range of the energy source to be used, a more exact wavelength to be used for the edge detection can be determined based on an absorption coefficient of the opaque layer. For example, the transmissivity of the layer with respect to the energy source is proportional to the inverse exponential: αd (that is, the product of the absorption coefficient and the thickness "d" of the opaque layer). The transmissivity at 2.0 eV is reduced by a power of four from the transmission at 1.11 eV, for example. In accordance with exemplary embodiments, an appropriate energy source can be infrared radiation where the opaque layer is a polysilicon layer.

An exemplary graph plotting photon energy (eV) against refractive indices is illustrated in FIG. 3A, and a graph plotting photon energy against absorption coefficients is illustrated in FIG. 3B. These graphs are from the aforementioned Tompkins book, at page 82.

In accordance with exemplary embodiments, edges between the shallow trench isolation regions and the silicon substrate 202 can be determined using reflectivity at these edges, taking into consideration refraction in two semi-infinite media with a homogenous dielectric film in between. A simplified treatment of a stratified dielectric media is described in a book entitled "Principles of Optics", 6th edition, Born and Wolf, at page 61.

In accordance with exemplary embodiments, after selecting a thickness of the planarized, opaque polysilicon layer and a wavelength of the laser source used for edge detection, an angle of incidence with which the layer source enters the silicon dioxide layer 204 is determined. This angle is selected so that an intensity of the energy source which is reflected by the polysilicon material, which has been obscured from view of the energy source by the opaque polysilicon layer, can be detected.

In accordance with exemplary embodiments, reflectivity can be determined using the refractive indices "n" of the material under consideration by the following Fresnel formulas:

$$r_{1,2} = \frac{n_1 \cos\theta_1 - n_2 \cos\theta_2}{n_1 \cos\theta_1 + n_2 \cos\theta_2} \quad (1)$$

$$r_{2,3} = \frac{n_2 \cos\theta_2 - n_3 \cos\theta_3}{n_2 \cos\theta_2 + n_3 \cos\theta_3} \quad (2)$$

For a three media example, such as where a silicon dioxide layer 204 having different characteristics (e.g., different thickness) than a silicon dioxide trench 206, is sandwiched between the silicon substrate 202 and the upper polysilicon layer 210, the total Fresnel reflectivity coefficient "r" can be determined as follows (that is, medium 1 is polysilicon, medium 2 is silicon dioxide, and medium 3 is crystalline silicon):

$$r = \frac{r_{12} + r_{23} e^{i2\beta}}{1 + r_{12} r_{23} e^{i2\beta}} \quad (3)$$

where:

$$\beta = \frac{2\pi}{\lambda_0} n_2 h \cos\theta_2 \quad (4)$$

In equation (4), "h" corresponds to the thickness of the silicon dioxide layer, and $\lambda_o$ corresponds to the wavelength of the incident light source. The total reflection can be evaluated as:

$$R = |r|^2 = \frac{r_{12}^2 + r_{23}^2 + 2 r_{12} r_{23} \cos 2\beta}{1 + r_{12}^2 r_{23}^2 + 2 r_{12} r_{23} \cos 2\beta} \quad (5)$$

For normal incidence, $\theta_1=\theta_2=\theta_3 0$ and, Equation (5) can be reduced to:

$$R = \left( \frac{n_1 n_3 - n_2^2}{n_1 n_3 + n_2^2} \right)^2 \text{ for } \cos 2\beta = -1 \quad (6)$$

and $$R = \left( \frac{n_1 - n_3}{n_1 + n_3} \right)^2 \text{ for } \cos 2\beta = 1.$$

Figure 3C:
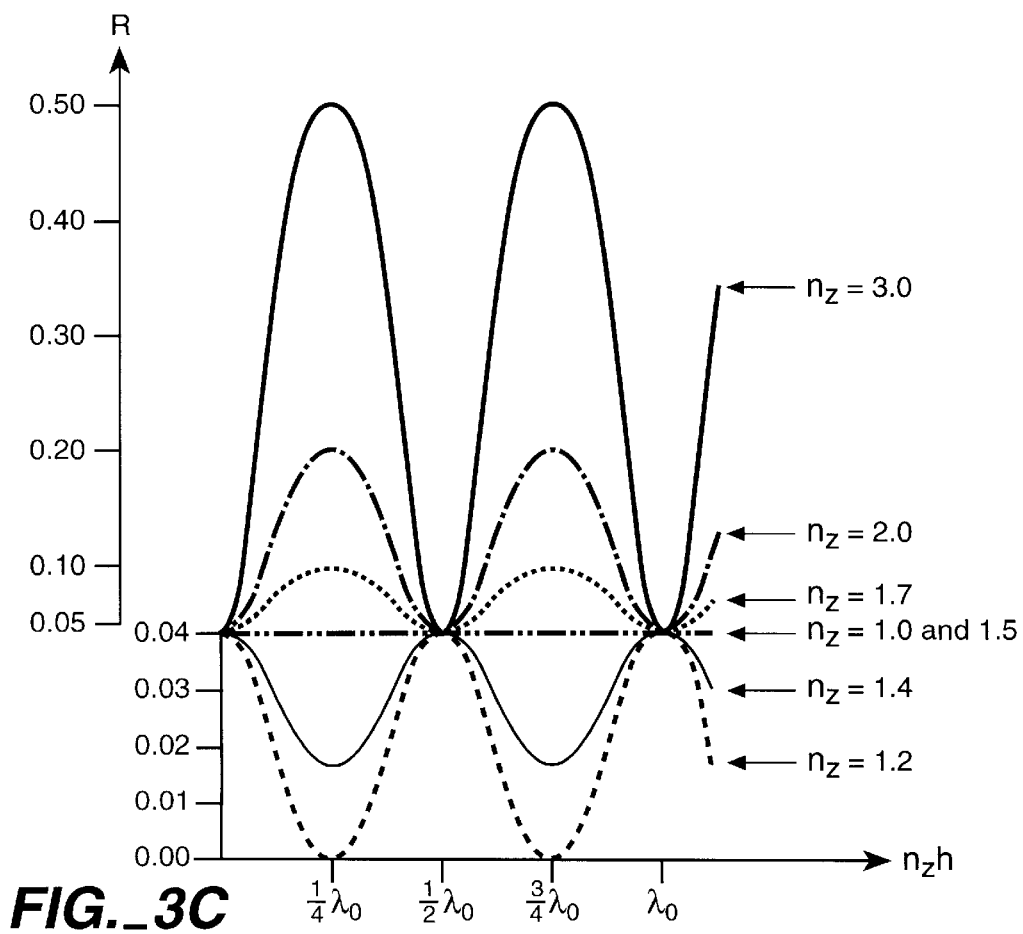
FIG. 3C illustrates reflectivity at normal incidence as a periodic function.

For the model represented by Equation (5), and as disclosed in the aforementioned Born and Wolf book entitled "Principles Of Optics", (e.g., p. 64), the reflectivity at normal incidence is a periodic function of path length in medium 2, where path length $n_2 h$ (or optical thickness) is the product of the refractive index "n" and the material thickness "h" of the medium ("h" being the thickness of the silicon dioxide layer in the above example), and where path length is varied by changing thickness. This is shown in FIG. 3C where, for a dielectric antireflection film, minima occur at ¼λ and ¾λ (where λ is the wavelength of the incident light), and maxima occur at ½λ and λ (or vice versa, depending on the reflectivities of the materials involved). An acceptable, and sufficient contrast between the mark and the adjacent area can be achieved at normal incidence with this model as shown in FIG. 3C.

Equations (1)–(5) are performed for the polycrystalline silicon as medium 1, a silicon dioxide layer as medium 2 and polycrystalline silicon as medium 3. The angles of $\theta_2$ and $\theta_3$ of FIG. 2A will follow from the selection of $\theta_1$. If the ultimate reflectivity of the oxide and the reflectivity of the silicon substrate are not sufficiently divergent, a different $\theta_1$ can be selected and then $\theta_2$ and $\theta_3$ can be recalculated to determine the new values of reflectivity for the silicon dioxide and crystalline silicon substrate layers. This process can be iteratively repeated using, for example, any iterative computer program process, until a suitable $\theta_1$ is selected for the material under consideration.

To evaluate Equation (5) for oblique incidence (that is, verify an acceptable range of angles which can be used for $\theta_1$ to avoid $\theta_2$ from being greater than 90°) Snell's law can be used to determine the intermediate angles of incidence through layers beneath the polysilicon in the direction of the incident beam:

$$n_1 \sin\theta_1 = n_2 \sin\theta_2 \qquad (7)$$

which reduces to $$\sin\theta_2 = \frac{n_1}{n_2} \sin\theta_1 \text{ or } \theta_2 = \sin^{-1}\left(\frac{n_2}{n_1} \sin\theta_1\right) \qquad (8)$$

Exemplary values are n=4.0 for polysilicon and crystalline silicon, k is approximately 0, and n=1.46 for silicon dioxide. For an exemplary wavelength of 1.2 $\mu$m, n=3.5 for single crystal silicon. However, for simplicity, consider n=4.10, the value for polysilicon.

The dependence of the second angle on the first angle is determined as follows.

$$\theta_2 = \sin^{-1}(2.73 \sin\theta_1) \qquad (9)$$

To obtain meaningful values for $\theta_2$, the first angle must be within the following range:

$$0° \leq \theta_1 \leq 21°; \qquad (10)$$

For laser light incident upon the FIG. 2 alignment mark at oblique angles greater than 21°, there will be total internal reflection. Thus, this is the critical angle for polysilicon.

For an exemplary intermediate angle which is halfway through the range of the oblique angle (namely, $\theta_1$=10), equation (9) can be used to determine that $\theta_2$=28°.

Using equations (1) and (2):

$$r_{12} = \frac{4.0 \cos(10°) - 1.46 \cos(28°)}{4.0 \cos(10°) + 1.46 \cos(28°)} = 0.51 \text{ and } r_{23} = -0.51$$

For $n_3$=3.5, $r_{23}$=−0.45 (Value for crystalline silicon): (11)

$$\beta = \frac{2\pi}{1.2 \times 10_m^{-6}} (1.46)(h)(1 \times 10_m^{-10})\cos(28°) \rightarrow \beta = (6.75 \times 10^{-4})h(\text{Å}) \qquad (12)$$

This gives the angle $\beta$ in radians and the length is converted to units of angstroms.

For the oblique angle used, the total reflection given by equation (5) can be determined as follows to verify that a sufficient contrast exists between reflectivity of the oxide and a reflectivity of the silicon substrate:

$$R(\beta) = \frac{(.51)^2 + (.51)^2 + 2(.51)^2\cos(2\beta)}{1 + (.51)^4 - 2(.51)^2\cos(2\beta)} \qquad (13)$$

For the area surrounding the alignment mark, h=60 angstroms, and $2\beta_1$=0.097 or 5°. For the shallow trench isolation region where the mark is, h=2500 angstroms, and $2\beta_2$=4.05 or 232°.

These are evaluated in equation (11) as:

$$R(60\text{Å}) = \frac{0.00367}{(0.37\%)}; R(2500\text{Å}) = \frac{0.60}{(60\%)}$$

Because the reflectivity of the FIG. 2 alignment mark is much greater over the trench than the area surrounding it, the contrast is great. Thus, oblique incidence provides enough contrast to accurately locate the alignment mark.

FIG. 2B illustrates another exemplary alignment mark. A determination of oblique incidence infrared layer illumination for edge detection will be described with respect to the FIG. 2B alignment mark. For a uniform layer of dielectric material starting at zero and ending at "z", a characteristic matrix based on the reference to Born and Wolf, at pages 55–60, is:

$$M_i = \begin{pmatrix} \cos(\beta_i) - \frac{i}{P_i} \sin(\beta_i) \\ -iP_i \sin(\beta_i) \cos(\beta_i) \end{pmatrix} \qquad (14)$$

$$P_i = n_i \cos(\theta_i); \beta_i = \frac{2\pi}{\lambda} n_i d_i(\theta_i) \qquad (15)$$

wherein $d_i$=the thickness of each layer, and $\theta_i$=angle with normal for $i^{th}$ layer In the exemplary FIG. 2B embodiment, an alignment mark 220 is shown to be formed with a silicon substrate 222. A silicon dioxide layer 224 is formed above the silicon substrate, and includes a silicon trench isolation region 226, with dimensions of the silicon dioxide being comparable to those described with respect to FIG. 2A. The silicon trench includes edges 228 and 230. Polysilicon layers 232 and 234 are formed on the planarized silicon dioxide layer 224. A resist layer 236 is deposited on the uppermost polysilicon layer 224.

A matrix for the FIG. 2B multilayer system is the product of matrices for all layers. As shown therein, four layers having two semi-infinite boundaries are illustrated, one of the boundaries being air and the other being the silicon substrate. The matrices are constructed as a function of layer thickness and angle of incidence in air. A matrix is formed for the crystalline silicon substrate with a thickness of 1 millimeter. A maximum angle for $\theta_1$ is 39.46°, such that $\theta_0$ is 90°.

Where the various layers 236, 234, 232, 224 and the substrate 222 are considered mediums 1–5, refractive indices "$n_i$" for i=1–5 are considered to be: $n_1$=1.5734; $n_2$=1.85; $n_3$=3.58; $n_4$=1.448; $n_5$=3.536; and $n_o$=1.0. Medium 1 is photoresist, medium 2 is SiON antireflect, medium 3 is polysilicon, medium 4 is SiO$_2$ and medium 5 is crystalline silicon. Thicknesses for these materials can be considered $d_1$=7200 angstroms; $d_2$=280 angstroms; $d_3$=2500 angstroms; $d_4$= 45 angstroms; $d_5$=1 million angstroms or 1 millimeter. For a $\theta_0$ of 0, and a wavelength $\lambda$ of 11,000, $\theta_1$ can be calculated as a function of $\theta_0$ as follows:

$$\theta1(\theta0) := a\sin\left(\frac{n0}{n1} \cdot \sin(\theta0)\right)$$

$\theta_0$ as a function of $\theta_1$ can be calculated as:

$$\theta0(\theta1) := a\sin\left(\frac{n1}{n0} \cdot \sin(\theta1)\right)$$

The value $P_1$ as a function of $\theta1$ can be calculated as:

$$pl(\theta1) := nl \cdot \cos(\theta1)$$

A value of $\beta_1$ can be calculated using equation (4), after which a product of the matrix $M_1$ can be calculated using the matrix equation (14). This operation can be repeated for each of $\theta_2$, $\theta_3$, $\theta_4$, and $\theta_5$ using the foregoing equations in similar fashion. In addition, values of $P_2$ through $P_5$, and matrix values $M_2$ through $M_5$ can be determined using equation (15). Afterwards, a matrix product can be calculated using the equations:

$$M(\theta 1, d1, d4) := M1(\theta 1, d1) \cdot M2(\theta 1) \cdot M3(\theta 1) \cdot M4(\theta 1, d4) \cdot M5(\theta 1)$$

$$a(\theta 1, d1, d4) := (M(\theta 1, d1, d4)_{0,0} + M(\theta 1, d1, 4d)_{0,1} \cdot p5(\theta 1)) \cdot p1(\theta 1)$$

$$b(\theta 1, d1, d4) := M(\theta 1, d1, d4)_{1,0} + M(\theta 1, d1, d4)_{1,1} \cdot p5(\theta 1)$$

$$r(\theta 1, d1, d4) := \frac{a(\theta 1), d1, d4) - b(\theta 1, d1, dr)}{a(\theta 1, d1, d4) + b(\theta 1, d1, d4)}$$

$$R(\theta 1, d1, d4) := r(\theta 1, d1, d4) \cdot \overline{r(\theta 1, d1, d4)}$$

Based on the foregoing example, a maximum angle for $\theta_1$ is approximately 39.46°, such that $\theta_0$ is 90°.

FIGS. 4A–4C illustrate various graphs of substrate reflectivity for varying angles, for varying resist thickness, and for varying oxide thickness. Referring to FIG. 4A, substrate reflectivity for suitable angles on and off the alignment marks are illustrated (i.e., $d_4$=45 off; $d_4$=3000 on). Thus, it is not necessary to use oblique incidence in accordance with exemplary embodiments of the present invention, and the reflectivity at the alignment mark is more than twice that of the surrounding areas at normal incidence.

In FIG. 4B, the resist thickness for normal incidence has been varied. As illustrated in FIG. 4B, this does not result in a change of substrate reflectivity.

FIG. 4C illustrates a variation in the oxide thickness over a range on the alignment mark and off the alignment mark as though chemical/mechanical processing has varied the thickness of the isolation trench oxide and the gate oxide layer. As illustrated in FIG. 4C, these variations can be resolved, because the surrounding area can be distinguished from the alignment mark when the oxide varies over a considerable regime.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for detecting edges through a planarized layer which is opaque to visible light, comprising the steps of:

selecting a thickness of the opaque layer;

determining a wavelength of an energy source to be used for edge detection, said wavelength being selected on the basis of an absorption coefficient of the opaque layer;

determining an angle of incidence with which the energy source enters the opaque layer; and detecting an intensity of the energy source which is reflected by material which has been obscured from view of-visible light by the opaque layer.

2. Method according to claim 1, wherein said opaque layer is polysilicon.

3. Method according to claim 1, further comprising a step of:

iteratively repeating said steps of selecting a thickness, determining a wavelength, and determining an angle of incidence until an acceptable angle of incidence is achieved.

4. A method according to claim 1, wherein said step of determining an angle of incidence further includes:

determining angles of incidence with respect to indices of refraction associated with multiple layers formed on at least one side of said opaque layer.

5. A method according to claim 1, wherein said step of determining an angle of incidence further includes:

determining angles of incidence with respect to indices of refraction associated with multiple layers formed on at least both sides of said opaque layer.

6. Method according to claim 1, wherein said step of detecting an intensity further includes a step of:

contrasting an intensity of the energy source reflected from one portion of said opaque layer with respect to a second intensity of the energy source reflected by at least one additional portion of said opaque layer with layers having different characteristics between said portions.

7. A method according to claim 1, further including a step of:

identifying an alignment mark on the basis of a detected intensity of the energy source.

8. A method according to claim 7, further including a step of:

aligning a semiconductor wafer based on identification of said alignment mark.

9. A method according to claim 1, wherein said angle of incidence is oblique.

10. A method according to claim 1, wherein said angle of incidence is normal to a surface of said opaque layer upon which said energy source is incident.

11. A method according to claim 1, wherein said energy source is a laser.

* * * * *